United States Patent [19]

Sugiyama et al.

[11] Patent Number: 5,568,609
[45] Date of Patent: Oct. 22, 1996

[54] DATA PROCESSING SYSTEM WITH PATH DISCONNECTION AND MEMORY ACCESS FAILURE RECOGNITION

[75] Inventors: Hitoshi Sugiyama, Fujieda; Toshinori Hiraishi, Mishima; Tuyoshi Kumano, Kawasaki, all of Japan

[73] Assignee: Fujitsu Limited, Kawasaki, Japan

[21] Appl. No.: 430,315

[22] Filed: Apr. 28, 1995

Related U.S. Application Data

[62] Division of Ser. No. 249,046, May 24, 1994, which is a continuation of Ser. No. 701,883, May 17, 1991, abandoned.

[30] Foreign Application Priority Data

May 18, 1990 [JP] Japan ................................ 2-128324
Jun. 29, 1990 [JP] Japan ................................ 2-171068

[51] Int. Cl.⁶ .......................................... G06F 11/00
[52] U.S. Cl. ...................... 395/183.19; 395/183.13; 395/183.15; 395/183.18; 395/700; 395/837
[58] Field of Search ................ 395/183.15, 185.02, 395/837, 700, 183.13, 183.18, 183.19

[56] References Cited

U.S. PATENT DOCUMENTS

| | | | |
|---|---|---|---|
| 3,668,644 | 6/1972 | Looschen | 395/182.04 |
| 3,906,452 | 9/1975 | Möder | 395/284 |
| 4,486,834 | 12/1984 | Kobayashi et al. | 395/475 |
| 4,546,454 | 10/1985 | Gupta et al. | 365/200 |
| 4,608,631 | 8/1986 | Stiffler et al. | 395/293 |
| 4,672,537 | 6/1987 | Katzman et al. | 395/185.09 |
| 4,748,587 | 5/1988 | Combes et al. | 395/185.08 |
| 4,757,442 | 7/1988 | Sakata | 395/650 |
| 4,794,568 | 12/1988 | Lim et al. | 365/185.09 |
| 4,807,228 | 2/1989 | Dahbura et al. | 395/182.11 |
| 4,872,166 | 10/1989 | Jippo | 371/11.1 |
| 4,958,273 | 9/1990 | Anderson et al. | 395/800 |
| 4,965,717 | 10/1990 | Cutts, Jr. et al. | 395/182.1 |
| 4,967,347 | 10/1990 | Smith et al. | 395/182.1 |
| 5,125,081 | 6/1992 | Chiba | 395/284 |
| 5,129,085 | 7/1992 | Yamasaki | 395/650 |
| 5,134,616 | 7/1992 | Barth, Jr. et al. | 371/10.3 |

*Primary Examiner*—Ken S. Kim

[57] ABSTRACT

A method is provided which controls a data processing system having two common memories forming a duplex memory, a plurality of clusters provided in common for the common memories, and input/output paths connecting the clusters to the common memories. The method includes the steps of detecting a failure which has occurred in one of the common memories by each of the clusters, physically disconnecting input/output paths connected to the above-mentioned one of the common memories therefrom when the failure is detected by one of the clusters, and inhibiting the clusters from accessing the above-mentioned one of the common memories in which the failure has occurred. There is also provided a data processing system that uses such a method.

8 Claims, 11 Drawing Sheets

FIG. 11

| TYPE OF ERROR REPORT | CONTROL INFORMATION IN REGISTER 132 | | PROCESS |
|---|---|---|---|
| | AREA 1 | AREA 2 | |
| ERROR IN AREA 1 | 1 | 1 | RECOGNIZE THAT A FAULT HAS OCCURRED IN AREA 1 AND DISCONNECT ALL CLUSTERS FROM AREA 1 |
| | 1 | 0 | RECOGNIZE THAT OWN CLUSTER IS DISCONNECTED FROM BOTH OF AREAS BY ANOTHER CLUSTER WHICH DETECTS CLUSTER FAILURE AND MAKE THE CLUSTER EXECUTE PREDETERMINED STOP PROCESS |
| | 0 | 1 | RECOGNIZE THAT ERROR HAS OCCURRED IN ALREADY INVALID AREA AND THUS NEGLECT THE ERROR |
| ERROR IN AREA 2 | 1 | 1 | RECOGNIZE THAT A FAULT HAS OCCURRED IN AREA 2 AND DISCONNECT ALL CLUSTERS FROM AREA 2 |
| | 1 | 0 | RECOGNIZE THAT ERROR HAS OCCURRED IN ALREADY INVALID AREA AND THUS NEGLECT THE ERROR |
| | 0 | 1 | RECOGNIZE THAT OWN CLUSTER IS DISCONNECTED FROM BOTH OF AREAS BY ANOTHER CLUSTER WHICH DETECTS CLUSTER FAILURE AND MAKE THE CLUSTER EXECUTE PREDETERMINED STOP PROCESS |

DATA PROCESSING SYSTEM WITH PATH DISCONNECTION AND MEMORY ACCESS FAILURE RECOGNITION

This application is a division of pending application Ser. No. 08/249,046, filed May 24, 1994, which is a continuation of Ser. No. 07/701,883, filed May 17, 1991, now abandoned.

BACKGROUND OF THE INVENTION

1. Field of the Invention

The present invention generally relates to a data processing system and, more particularly, to a data processing system having at least one memory provided in common for a plurality of clusters, each cluster having a processor. Further, the present invention is concerned with a method for controlling such a data processing unit.

2. Description of the Related Art

Generally, recent data processing systems tend to be provided with at least one common memory provided in common for a plurality of clusters. This tendency results from the fact that the processing speed of a single processor can no longer be greatly increased and from the fact that a data processing system having enhanced reliability is required. Normally, important data used in common for a plurality of clusters is stored in the common memory, and thus in many cases, two common memories which form a duplex memory are used in order to enhance the reliability of the data processing system.

FIG. 1A shows a related data processing system, which has two common memories 1-1 and 1-2, each provided in common for clusters 2a and 2b. The common memories 1-1 and 1-2 have a control table 5. The access to each of the memories 1-1 and 1-2 is controlled by using the control table 5. As shown in FIG. 1A, the control table 5 has information showing whether or not a storage area 1 of the common memory 1-1 and a storage area 2 of the common memory 2-2 is allowed to be accessed.

If the cluster 2a detects a fault which has occurred in the area 1 of the common memory 1-1, the cluster 2a writes, into the control table 5, information showing that the area 1 cannot be used. The other cluster 2b refers to the control table 5 before starting an accessing operation, and determines whether or not use of any area is inhibited. In the case being considered, since use of the area 1 of the common memory 1-1 is not allowed, the cluster 2b is allowed to access only the area 2 of the common memory 20-2. In the above-mentioned way, use of the defective area 1 of the common memory 1-1 is inhibited, and the area 2 of the remaining common memory 1-2 can be used in common for the clusters 2a and 2b.

FIG. 1B shows another related arrangement of the data processing system having the common memories 1-1 and 1-2. The clusters 2a and 2b have control tables 5-1 and 5-2, respectively, in place of the control table 5 shown in FIG. 1A. When a fault occurs, the clusters 2a and 2b start to communicate with each other. For example, when the cluster 2a detects a fault which has occurred in the common memory 1-1, the cluster 2a writes information showing that the area 1 is inhibited from being accessed into the control table 5-1, and informs the cluster 5-2 of such information. Then, the cluster 2b writes the information showing that the area 1 is inhibited from being accessed into the control table 5-2. During the above-mentioned operation, it is necessary to stop the normal processes of all the clusters 2a and 2b. In the above-mentioned way, one of the clusters 2a and 2b detects any failure in the areas 1 and 2, and both of the clusters 2a and 2b use the remaining common memory 1-2.

However, the related system shown in FIG. 1A has the following disadvantages. First, it is necessary to refer to the control table 5 provided on the common memory side and determine whether or not the requested access is allowed. A long time and a complex logical control are needed to complete this operation. Second, the input path which connects the common memory 1-1 set to the access inhibiting state is not physically disconnected from the clusters 2a and 2b. Thus, there is a possibility that the common memory 1-1 will be accessed. Third, if a failure occurs in the control table 5, or a contradiction in information stored in the control table 5 takes place, the system may malfunction.

The related system shown in FIG. 1B has the following disadvantages. First, it is necessary for the defective cluster 2a to inform the cluster 2b of the occurrence of a failure in the area 1 of the common memory 1-1. This requires complex processing. Further, the system shown in FIG. 1B has the disadvantages as described above with regard to the system shown in FIG. 1A.

On the other hand, if a failure occurs in one of the clusters 2a and 2b, the system operates as follows. For example, as shown in FIG. 2, if the cluster 2b detects a failure which has occurred in the cluster 2a, the cluster 2b writes information showing that the cluster 2a is down or has failed into a corresponding area of the control table 5 of a common memory 1A. When the cluster 2a starts the access operation, it refers to the control table 5 in the common memory 1A, and recognizes that it is inhibited from being accessed. Thus, the cluster 2a stops the operation of its own processor (not shown).

However, if the cluster 2a having a failure fails to access the control table 5 provided in the common memory 5, it may destroy data stored in the common memory 5. Further, if data in the control table 5 is damaged, the clusters 2a and/or 2b may malfunction. Furthermore, each time each of the clusters 2a and 2b try to access the common memory 1A, it is necessary for each cluster to determine whether or not it itself is held in the access inhibiting state. Such a determination requires a large amount of time and a complex logical control. Further, it takes a long time to stop the defective cluster after it has been detected.

SUMMARY OF THE INVENTION

It is a general object of the present invention to provide an improved data processing system in which the above-mentioned disadvantages are eliminated.

A more specific object of the present invention is to provide a data processing system capable of immediately operating with only one common memory working if a failure has occurred in the other common memory.

The above-mentioned objects of the present invention are achieved by a data processing system comprising: two common memories forming a duplex memory; a plurality of clusters, each accessing the common memories; a plurality of input/output paths connecting the common memories and the clusters; and input/output path disconnecting means for physically disconnecting the plurality of input/output paths from the common memories. Each of the clusters comprises: control information storing means for storing control information showing whether each of the common memories is valid or invalid; input/output path disconnection processing means for writing control information showing that a corresponding one of the common memories is invalid into the control information storing means when the input/output path disconnection processing means is informed of the occurrence of a failure in one of the common memories and for instructing the input/output path disconnecting means, so that all input/output paths connected to the corresponding one of the common memories which is invalid are physically disconnected therefrom; and access inhibit processing means for writing control information showing that the corresponding one of the common memories is invalid into the control information storing means when each of the clusters other than a cluster informed of the occurrence of the failure has access to the above-mentioned one of the common memories via the input/output paths which have been disconnected therefrom by the input/output disconnecting means.

Another object of the present invention is to provide a data processing system capable of preventing the contents of a common memory from being damaged if a cluster fails.

This above object of the present invention is achieved by a data processing system comprising: at least one common memory; a plurality of clusters, each accessing the common memory; a plurality of input/output paths connecting the common memory and the clusters; and input/output path disconnecting means for physically disconnecting the plurality of input/output paths from the common memory. Each of the clusters comprises: input/output path disconnection processing means for controlling the input/output path disconnecting means, so that when a failure has occurred in one of the clusters, all input/output paths connected to the above-mentioned one of the clusters are physically disconnected from the above-mentioned one of the clusters by the input/output path disconnecting means; and cluster failure recognition processing means for stopping its own operation when the above-mentioned one of the clusters in which the failure has occurred recognizes that the failure has occurred in its own cluster.

Yet another object of the present invention is to provide a method for controlling a data processing system which makes it possible to immediately operate with only one common memory working if a failure has occurred in the other common memory.

This above object of the present invention is achieved by a method for controlling a data processing system which has two common memories forming a duplex memory, a plurality of clusters provided in common for the common memories, and input/output paths connecting the clusters to the common memories, the method comprising the steps of: detecting a failure which has occurred in one of the common memories by each of the clusters; physically disconnecting input/output paths connected to the above-mentioned one of the common memories therefrom when the failure is detected by one of the clusters; and inhibiting the clusters from accessing the above-mentioned one of the common memories in which the failure has occurred.

A further object of the present invention is to provide a method for controlling a data processing system capable of preventing the contents of a common memory from being damaged if a cluster fails.

This above object of the present invention is achieved by a method for controlling a data processing system which has at least one common memory, a plurality of clusters provided in common for the common memory, and input/output paths connecting the clusters to the common memory, the method comprising the steps of: supervising states of other clusters; physically disconnecting input/output paths provided between the common memory and one of the clusters when a failure has occurred in the above-mentioned one of the clusters; and stopping an operation of the above-mentioned one of the clusters in which the failure has occurred.

BRIEF DESCRIPTION OF THE DRAWINGS

Other objects, features and advantages of the present invention will become apparent from the following detailed description when read in conjunction with the accompanying drawings, in which:

FIG. 11 is a diagram showing the relationship between an error report and contents of a register circuit of a control information block shown in FIG. 10.

DESCRIPTION OF THE PREFERRED EMBODIMENTS

Figure 1A:
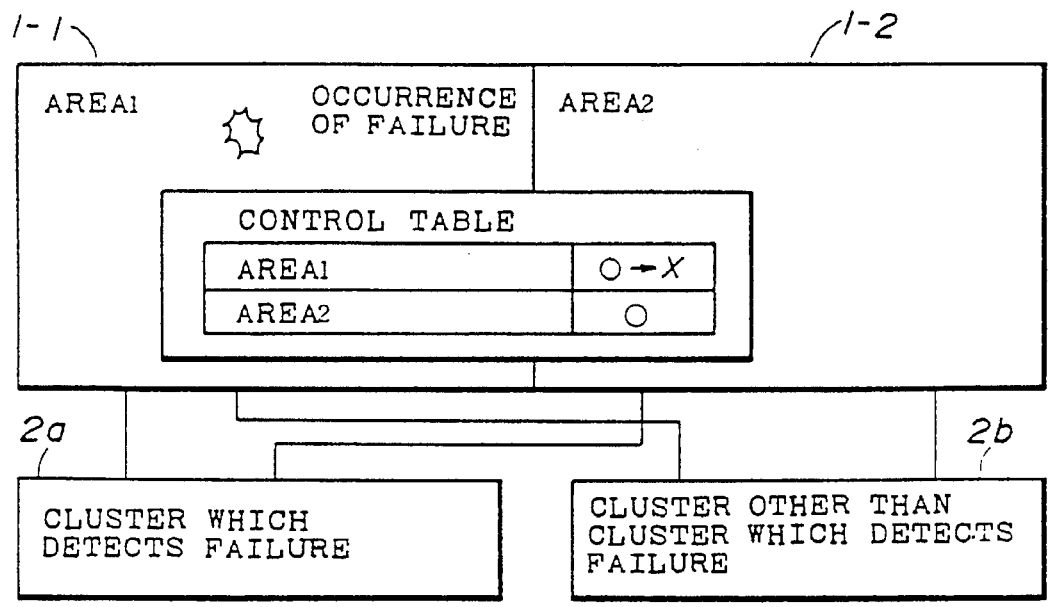
FIG. 1A is a block diagram of a related data processing system.
Figure 1B:
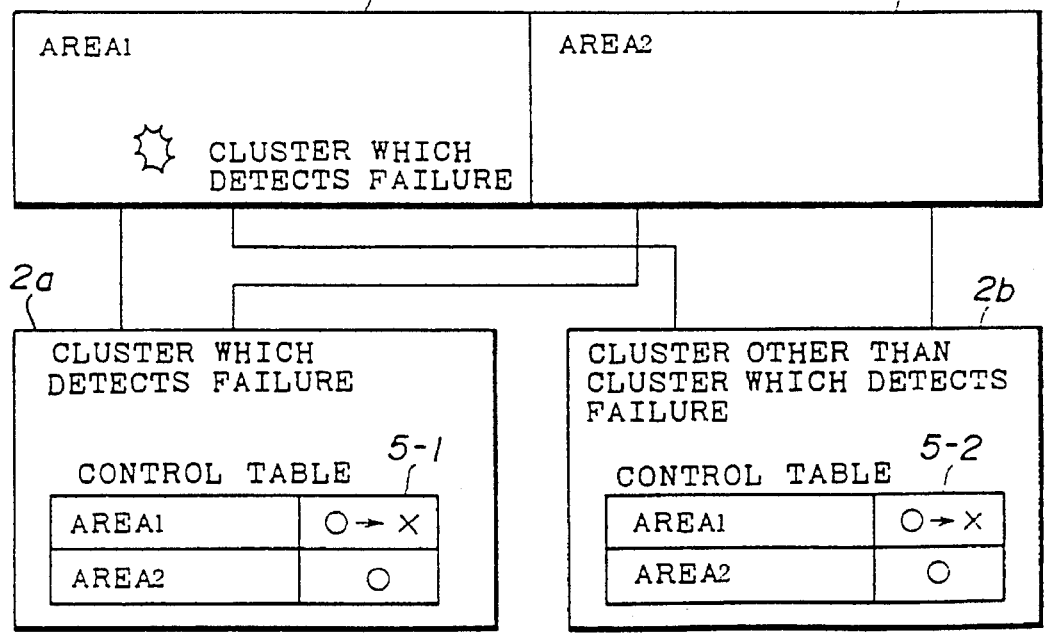
FIG. 1B is a block diagram of another related data processing system.
Figure 2:
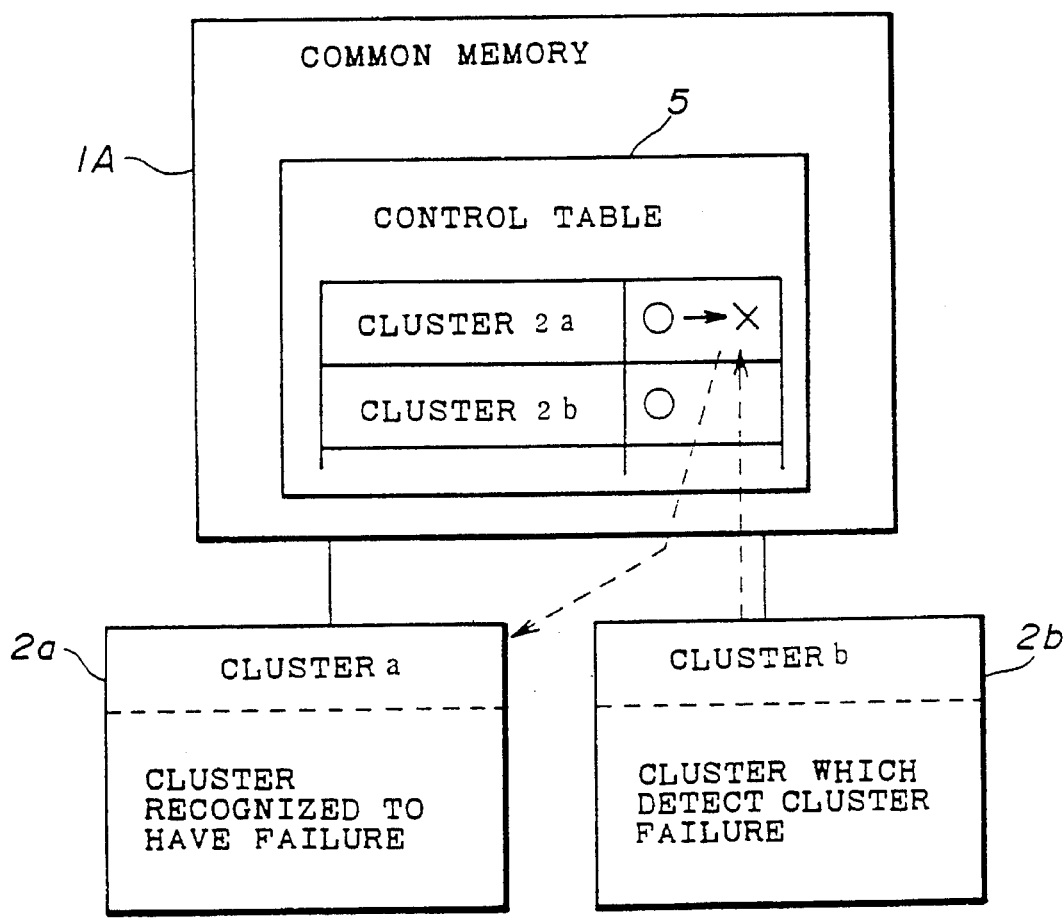
FIG. 2 is a block diagram of still another related data processing system.
Figure 3:
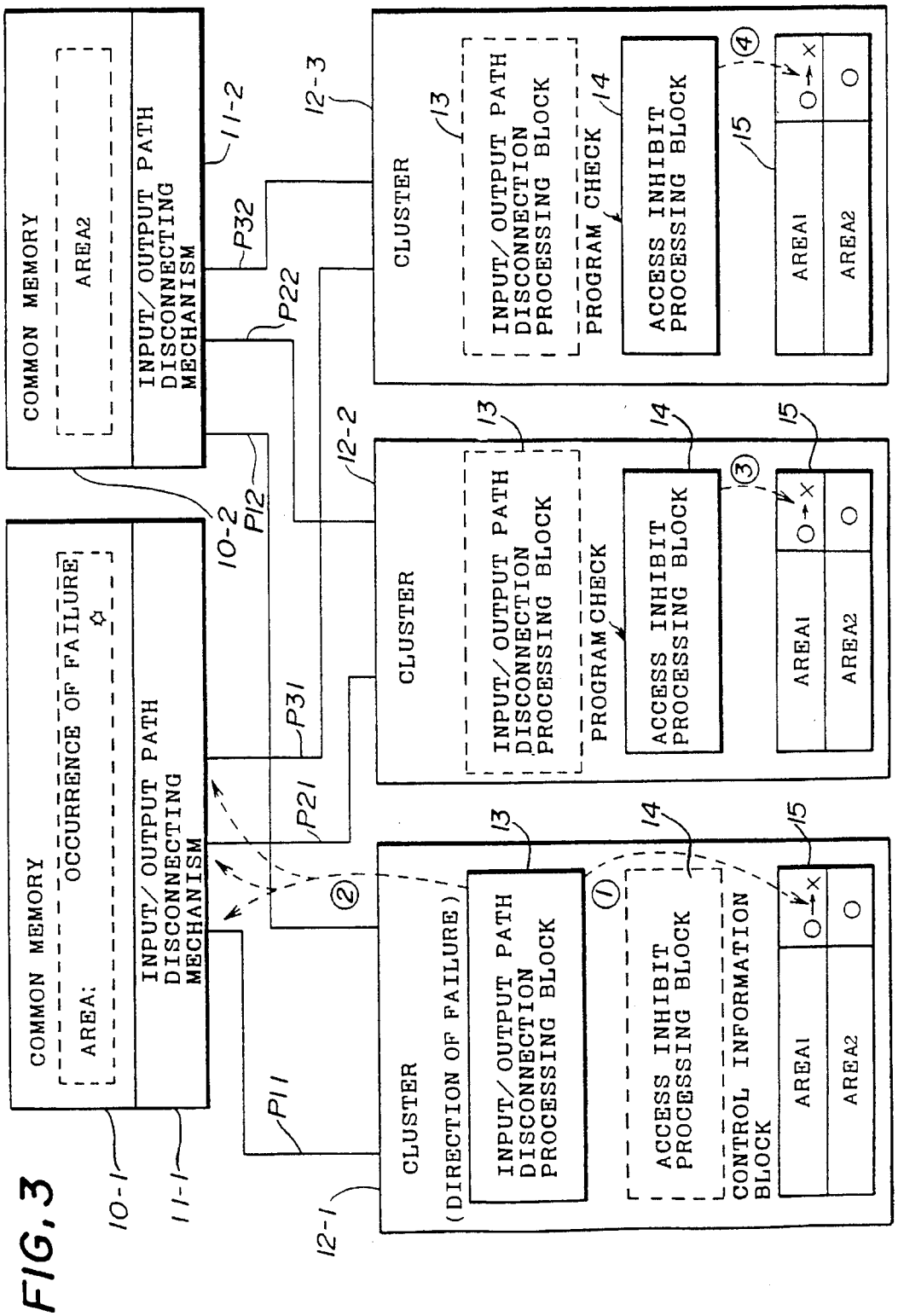
FIG. 3 is a block diagram showing an outline of a first preferred embodiment of the present invention.

FIG. 3 shows the principle of a data processing system according to a first preferred embodiment of the present invention. The system shown in FIG. 3 has common memories 10-1 and 10-2 which form a duplex memory, input/output path disconnecting mechanisms 11-1 and 11-2, and clusters 12-1 through 12-3, each cluster having a processor, such as a central processing unit or a microprocessor. Each of the clusters 12-1 through 12-3 includes an input/output path disconnection processing block 13, an access inhibit processing block 14 and a control information block 15. The disconnection processing block 13 carries out a process of physically disconnecting corresponding input/output paths from the common memories 10-1 and 10-2. The access inhibit processing block 14 inhibits access to the common memories 10-1 and 10-2 in advance. The control information block 15 has access management information about the common memories 10-1 and 10-2. The common memory 10-1 is connected to the clusters 12-1, 12-2 and 12-3 through input/output paths P11, P21 and P31, respectively. The common memory 10-2 is connected to the clusters 12-1, 12-2 and 12-3 through input/output paths P12, P22 and P32, respectively.

The input/output path disconnecting mechanism 11-1, which is formed of hardware, has the function of physically disconnecting each of the input/output paths P11, P21 and P31 from the common memory 10-1. Similarly, the input/output path disconnecting mechanism 11-2, which is also formed of hardware, has the function of physically disconnecting each of the input/output paths P12, P22 and P32 from the common memory 10-2. When one of the clusters 12-1 through 12-3 has access to the common memory 10-1 or 10-2 which has been disconnected from the input/output paths by the input/output path disconnecting mechanism 11-1 or 11-2, the accessed disconnecting mechanism generates a restorable error (program check), and sends this restorable error to the cluster which has generated the request for accessing caused by, for example, a program interruption.

Each of the clusters 12-1 through 12-3 has the control information block 15, which manages control information used for deciding whether the area 1 of the common memory 10-1 or the area 2 of the common memory 10-2 should be accessed. Such control information is stored in a local memory of each of the clusters 12-1 through 12-3. For example, when the cluster 12-1 detects the occurrence of a failure in the area 1 of the common memory 10-1, or when the cluster 12-1 externally receives an instruction to disconnect the common memory 10-1, the disconnection processing block 13 sets information showing that use of the area 1 is inhibited into its own control information block 15 (① shown in FIG. 3). Thereby, the common memory 10-1 is physically disconnected from the input/output paths P11, P21 and P31 respectively connecting all the clusters 12-1 through 12-3 (② shown in FIG. 3).

If one of the the clusters 12-2 and 12-3 accesses the area 1 of the common memory 10-1, the input/output path disconnecting mechanism 11-1 generates the aforementioned restorable program check. The term "restorable" means that a predetermined process such as an error interrupt process is carried out and then the process which was carried out before the predetermined process was started is restored. The access inhibit processing blocks 14 of the clusters 12-2 and 12-3 detect the restorable program check, and recognize that use of the area 1 of the common memory 10-1 is not allowed. In order not to access the area 1 after this, the access inhibit processing blocks 14 write information showing that use of the area 1 is inhibited into the control information blocks 15 (③ and ④ shown in FIG. 3). As a result, all the clusters 12-1, 12-2 and 12-3 are allowed to access only the area 2 of the common memory 10-2, so that damage to duplicated data stored in the common memories 10-1 and 10-2 can be prevented. It should be noted that the clusters 12-2 and 12-3 other than the cluster 12-1 which has detected the occurrence of a failure in the area 1 of the common memory 10-1 can recognize that the area 1 has been disconnected without any communication between the clusters taking place. This also increases the speed of access to the duplicated data in the common memories 10-1 and 10-2. It should be noted that access to the local memory storing the control information is made faster than access to the common memories 10-1 and 10-2. In addition, it should be noted that the complex logical control as used in the related system is not used in the system shown in FIG. 3.

Figure 4:
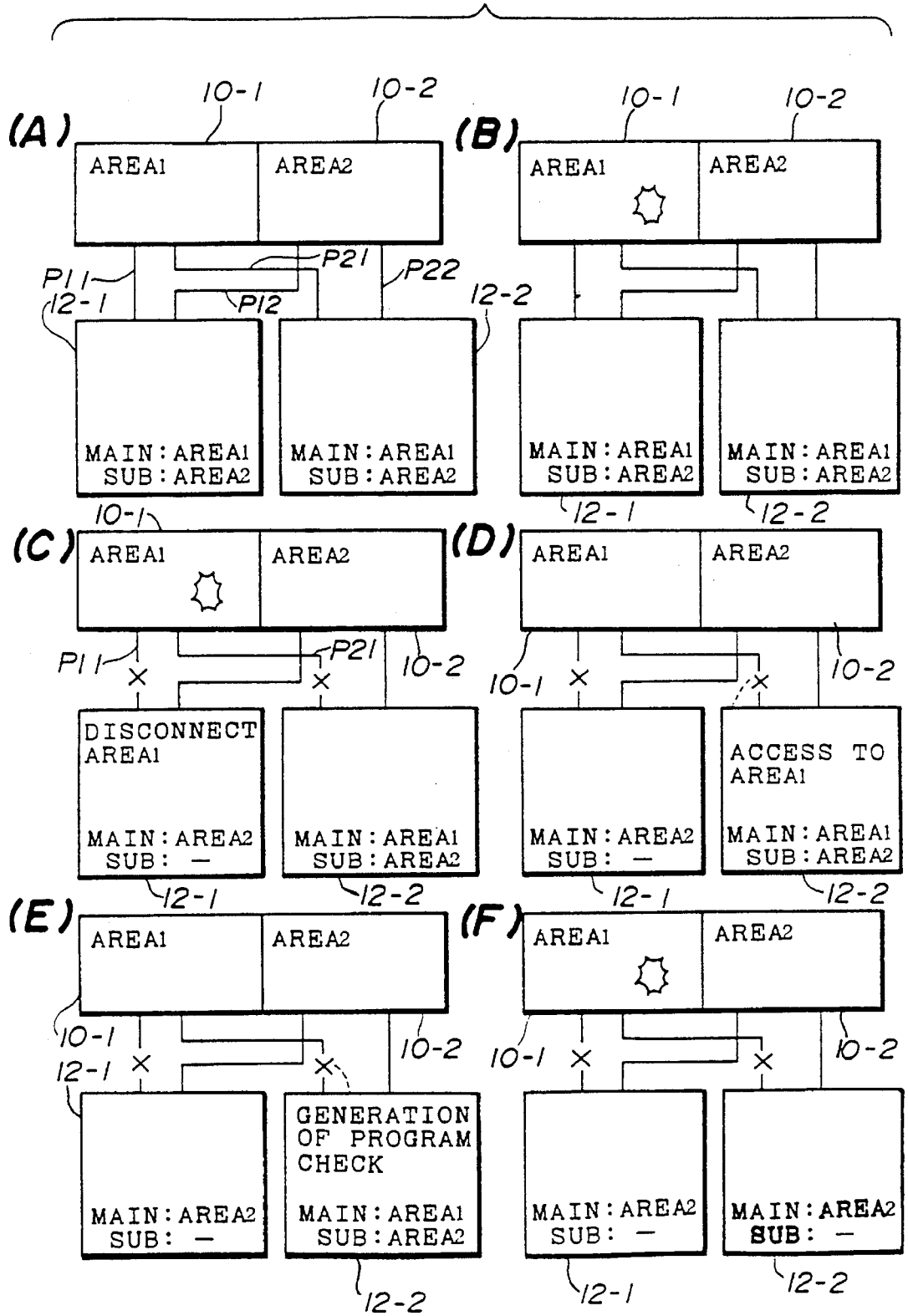
FIG. 4 is a block diagram showing the operation of the system shown in FIG. 3.

FIG. 4 shows an example of the state transition of the system shown in FIG. 3, in which, although two clusters 12-1 and 12-2 are illustrated, the state transition shown in FIG.4 can be applied to a system having more than two clusters in the same way. FIG. 4(A) shows a system operating state in which the area 1 of the common memory 10-1 functions as a main memory system and the area 2 of the common memory 10-2 functions as a sub-memory system. The main memory system is subjected to read and write accesses, while the sub-memory system is subjected to only a write access.

As shown in FIG. 4(B), the cluster 12-1 has access to the area 1 of the common memory 10-1 and detects a failure which has occurred in the area 1. As shown in FIG. 4(C), the cluster 12-1 replaces the control information in the control information block 15 so that the control information shows that the area 2 is the main memory system and use of the area 1 is inhibited. In addition, the cluster 12-1 instructs the disconnecting mechanism 11-1 to disconnect the input/output path P11 provided between the cluster 12-1 and the area 1 and the input/output path P21 provided between the cluster 12-2 and the area 1. At this time, the control information in the cluster 12-2 is not changed.

As shown in FIG. 4(D), the cluster 12-2 generates a request to access the area 1 in order to read duplicated data in the common memory 10-1. Since all the input/output paths P11 and P21 have been disconnected from the common memory 10-1, as shown in FIG. 4(E), the restorable program check occurs in response to the above-mentioned request. The cluster 12-2 recognizes that the area 1 has been disconnected and, as shown in FIG. 4(F), replaces its own control information, so that the area 2 is the main memory system and use of the area 1 is inhibited. After that, the clusters 12-1 and 12-2 do not have access to the area 1, and the entire system works with only the common memory 10-2 operating. It is also possible to disconnect the area 1 in response to an instruction input by the operator.

Figure 5:
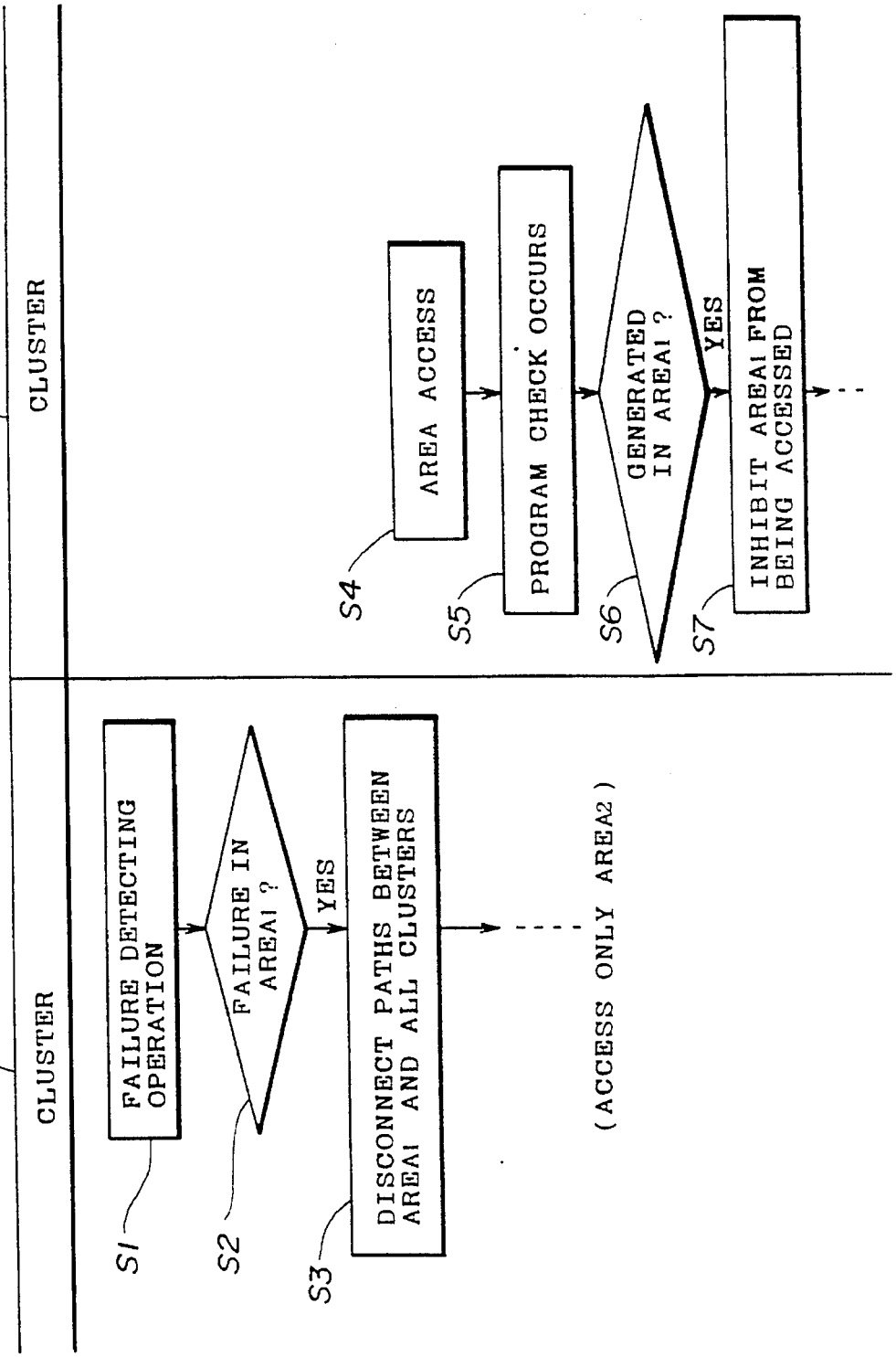
FIG. 5 is a flowchart showing the operation of the system shown in FIG. 3.

The above-mentioned operation is depicted in FIG. 5. At step S1, the input/output path disconnection processing block 13 of the cluster 12-1 detects a failure which has occurred in one of the areas 1 and 2. At step S2, the disconnection processing block 13 of the cluster 12-1 determines whether the detected failure has occurred in the area 1 or area 2. If the failure has occurred in the area 1, at step S3 the disconnection processing block 13 of the cluster 12-1 replaces the control information stored in the control information block 15, and sends the instruction to disconnect all the input/output paths from the common memory 10-1 to the input/output path disconnecting mechanism 11-1. If the failure has occurred in the area 2, the input/output paths connected to the common memory 10-2 are disconnected therefrom, due to the function of the input/output path disconnecting mechanism 11-2, in response to the instruction from the disconnection processing block 13.

It is now assumed that the cluster 12-2, which does not yet know about the disconnection of all the input/output paths from the common memory 10-1, accesses the disconnected area at step S4. In response to this accessing, the program check is generated at step S5. Then, the access inhibit processing block 14 of the cluster 12-2 judges, at step S6, whether the program check has been generated by accessing the area 1 or area 2. If the program check has been generated by accessing the area 1, the access inhibit processing block 14 replaces the control information in the control information block 15, so that it shows that use of the area 1 is inhibited. On the other hand, if the program check has been generated by accessing the area 2, the control information is replaced, so that it shows that use of the area 2 is inhibited. After this, the system works with only one of the common memories 10-1 and 10-2 operating.

Each of the input/output path disconnecting mechanisms 11-1 and 11-2 can be comprised of a device capable of physically disconnecting input/output paths from the common memory, such as a switch or a logical gate.

Figure 6:
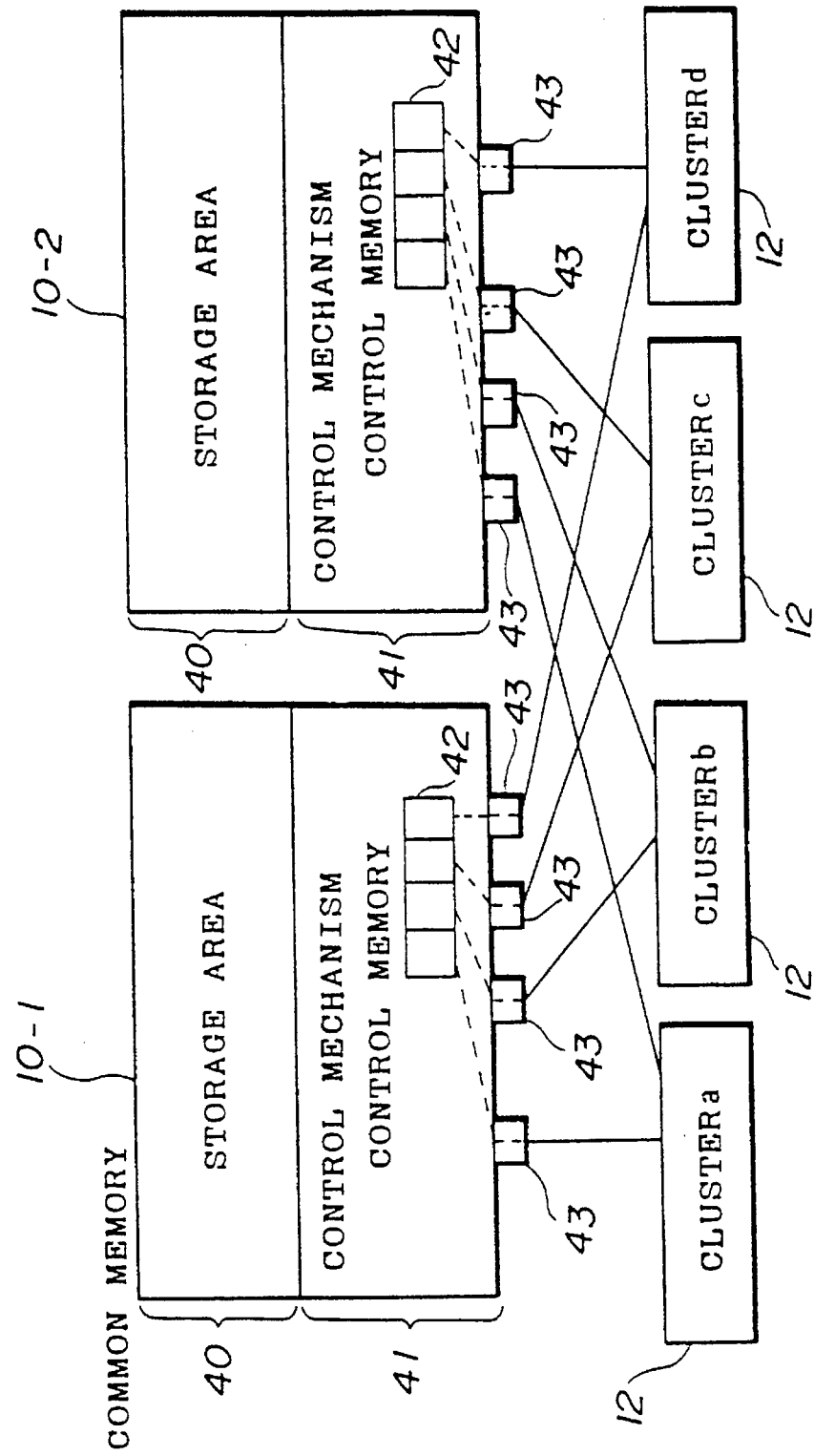
FIG. 6 is a block diagram of input/output path disconnecting mechanisms provided in the system shown in FIG. 3.

FIG. 6 shows the respective outlines of the input/output path disconnecting mechanisms 11-1 and 11-2. As shown, each input/output path disconnecting mechanism has a storage mechanism 40 corresponding to the aforementioned area 1 or 2, and a control device 41 having a control memory 42. Each of the disconnecting mechanisms 11-1 and 11-2 is realized by the control device 41. Each of the control devices 41, which is formed of, for example, a processor or a microprocessor, executes the entire control of the common memory, and communicates with the clusters 12. Each of the control devices 41 has ports 43 provided for the respective clusters 12 (clusters a, b, c and d). Each of the ports 43 has two states, namely a valid state and invalid state. Such states of each of the ports 43 are controlled by one-bit control information stored in a corresponding area of the control memory 42. The control memory 42 shown in FIG. 6 has four one-bit storage areas. It should be noted that the control memory 42 is provided separately from the storage area 40.

When the bit in a one-bit area in the control memory 42 is "1", the corresponding port 43 is maintained in the valid state, and the cluster 12 assigned to this port 43 can communicate with the common memory. In this state, it is possible to not only perform data transfer with the common memory but also replace the contents of the entire control memory 42. That is, the clusters 12 connected to the ports 43 maintained in the valid state can change the states of the other ports 43. The clusters 12 maintained in the invalid state cannot perform data transfer with the storage mechanism 40 but also cannot change the contents of the control memory 42.

A description will now be given of a second preferred embodiment of the present invention with reference to FIGS. 7 through 9. The second preferred embodiment is directed to coping with a failure which takes place in any of the clusters.

Figure 7:
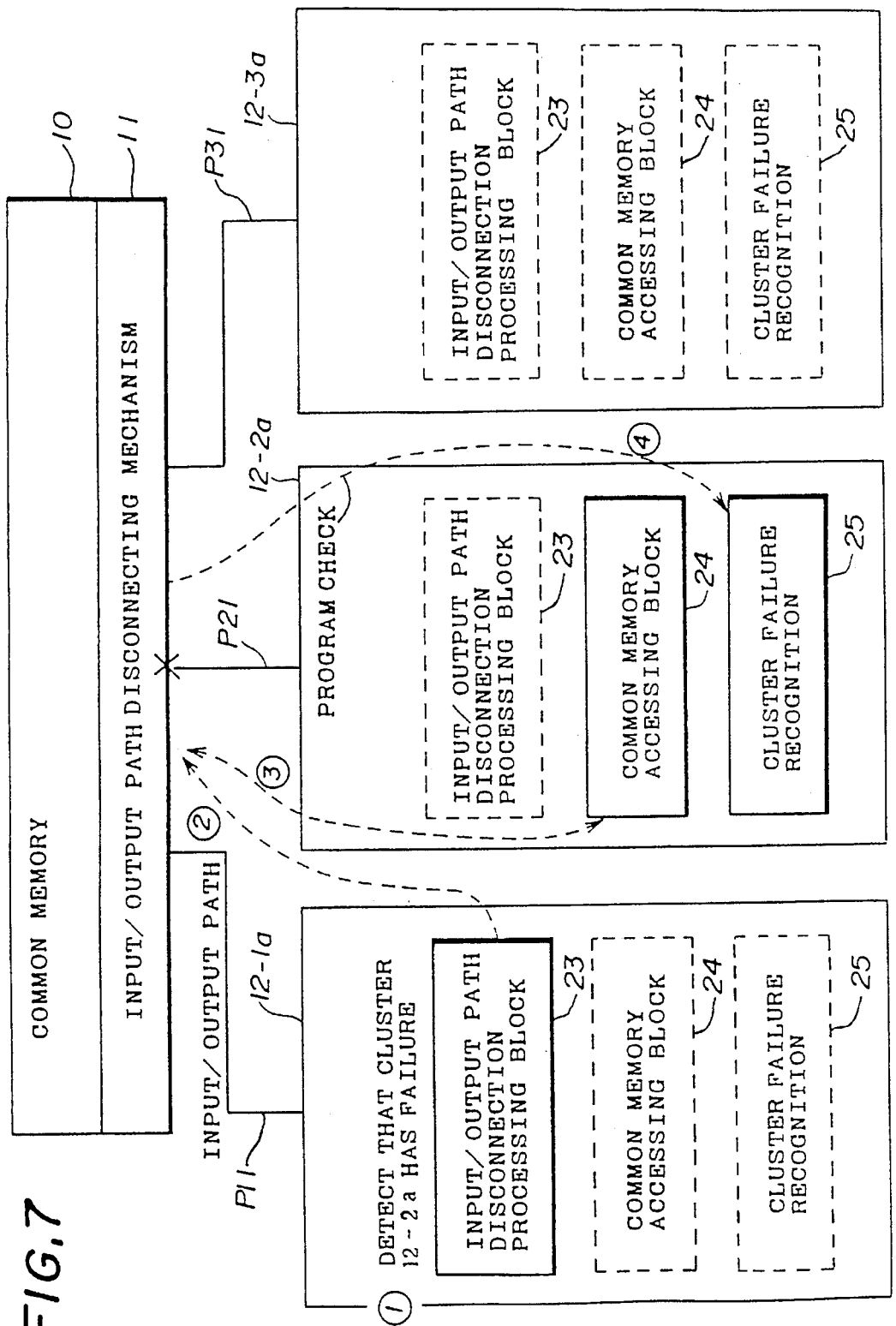
FIG. 7 is a block diagram showing an outline of a second preferred embodiment of the present invention.

FIG. 7 shows the outline of a data processing system according to the second embodiment of the present invention. The system shown in FIG. 7 includes a common memory 10, an input/output path disconnecting mechanism 11 and clusters 12-1a, 12-2a and 12-3a. Each of the clusters 12-1a, 12-2a and 12-3a includes an input/output path disconnection processing block 23, a common memory accessing block 24 and a cluster failure recognition processing block 25. Input/output paths P11, P21 and P31 respectively connected to the clusters 12-1a, 12-2a and 12-3a are connected to the common memory 10 via the input/output path disconnecting mechanism 11, which has the function of physically disconnecting the common memory 10 from the input/output paths P11, P21 and P31.

Each of the clusters 12-1a, 12-2a and 12-3a supervises the states of the other clusters. It will now be assumed that the input/output path disconnection processing block 23 of the cluster 12-1a detects the fact that the cluster 12-2a fails (see ① shown in FIG. 7). The input/output path disconnection processing block 23 of the cluster 12-1a makes the path disconnecting mechanism 11 disconnect the input/output path P21 from the common memory 10 (② shown in FIG. 7). After this, if the common memory accessing block 24 of the cluster 12-2b which fails accesses the common memory 10 (③ in FIG. 7), the aforementioned program check (restorable program error) is generated (④ in FIG. 7), since the input/output path P21 has been disconnected from the common memory 10. It will be noted that even if the cluster 12-2a fails, the common memory accessing block 24 may be operating. The program check is transferred to the cluster failure recognition processing block 25 of the cluster 12-2a. The cluster failure recognition processing block 25 recognizes that its own cluster 2 failed in such a way that the input/output path P21 is disconnected from the common memory 10. Then, the cluster 12-2a executes predetermined processes, such as a login process and error process. After this, the cluster 12-2a stops its own operation by itself.

Even if the cluster 12-2b malfunctions due to the occurrence of a runaway, it is possible to prevent destruction of the contents of the common memory 10 since the input/output path P21 is disconnected from the common memory 10. Since it is not necessary for each cluster to judge whether or not it itself has been made down at the time of accessing the common memory 10, it becomes possible to access the common memory at a higher speed and avoid use of a complex logical control.

Figure 8:
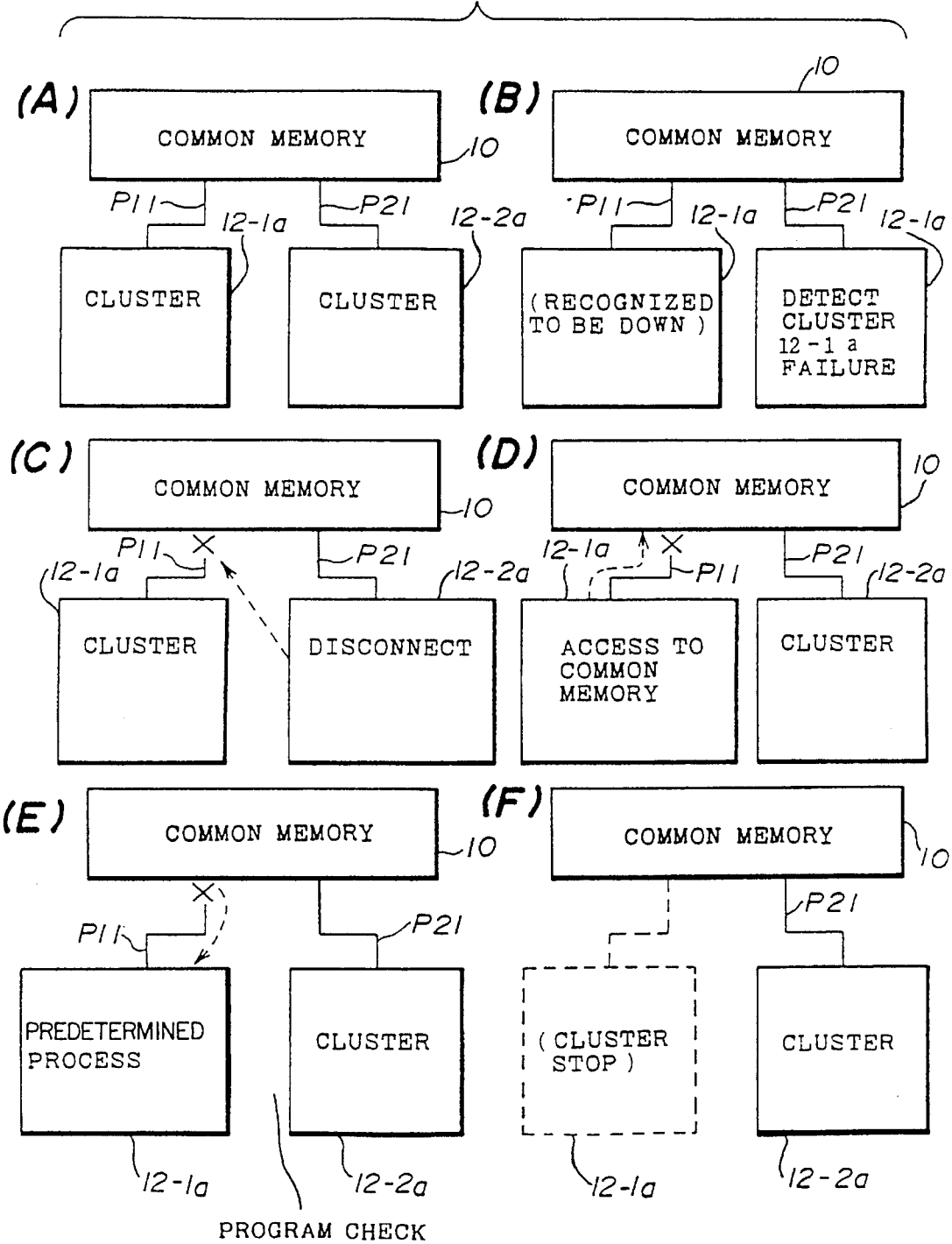
FIG. 8 is a block diagram showing the operation of the system shown in FIG. 7.

FIG. 8 shows the operation of the second embodiment of the present invention. For the sake of simplicity, the cluster 12-3a shown in FIG. 7 is omitted. FIG. 8(A) shows the normal operating state where the clusters 12-1a and 12-2a are normally working. In this state, each of the clusters 12-1a and 12-2a can access the common memory 10 via the input/output paths P11 and P21, respectively.

FIG. 8(B) shows a state in which the cluster 12-2a detects the fact that the cluster 12-1a fails. Alternatively, the cluster 12-2a is informed of this fact by a command. As shown in FIG. 8(C), the cluster 12-2a makes the input/output path disconnecting mechanism 11 (not shown in FIG. 8 for the sake of simplicity) physically disconnect the input/output path P11. In the case where the system includes more than one common memory, all input/output paths extending from the cluster 12-1a to the common memories are disconnected by the input/output path disconnecting mechanism 11.

After this, as shown in FIG. 8(D), the cluster 12-1a accesses the common memory via the input/output path P11 in order to carry out a certain or desired process. Since the input/output path P11 has been disconnected from the common memory 10, the interrupt of the program check occurs. As shown in FIG. 8(E), the cluster 12-1a recognizes that it has been set in a failed state by disconnecting the input/output path P11 from the common memory 10. Then, the cluster 12-1a carries out the predetermined processes. The cluster 12-1a (more specifically, the processor thereof) finally stops due to the execution of the predetermined processes. Then, as shown in FIG. 8(F), only the cluster 12-2a operates.

Each of the clusters 12-1a through 12-3a can detect the fact that any of the other clusters fails in any of the following ways. For example, each of the clusters sends the other clusters a message showing that it is normally operating. It is also possible to provide the common memory 10 with counters provided for the respective clusters, each being reset each time it counts a predetermined number. In this case, each cluster resets the count value in the corresponding counter within a predetermined time, and refers to the counters related to the other clusters. If the count value has not been reset within the predetermined time, it is determined that the cluster fails.

Figure 9:
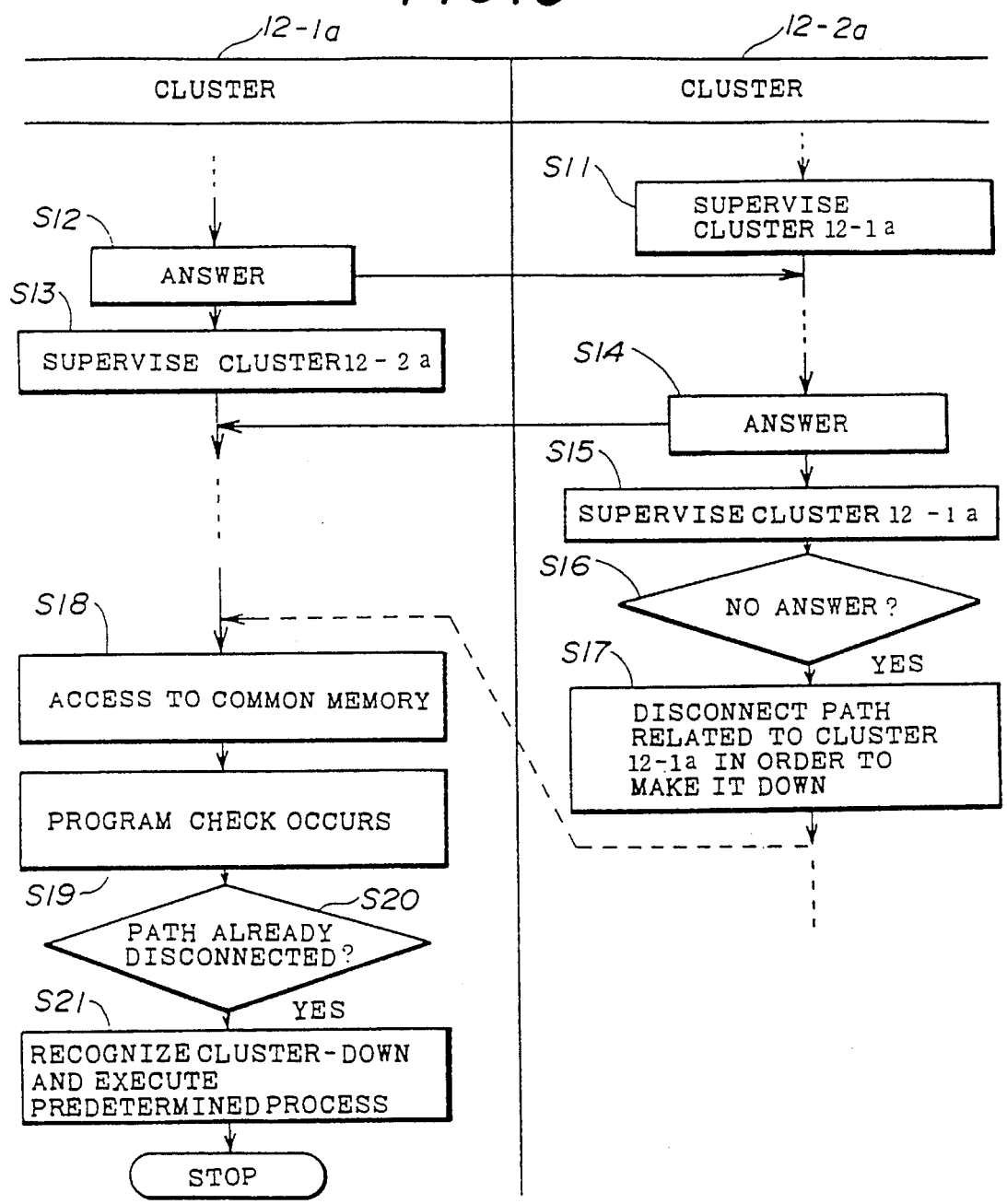
FIG. 9 is a flowchart showing the operation of the system shown in FIG. 7.

FIG. 9 is a flowchart showing the operation of the second embodiment of the present invention explained with reference to FIG. 8. At step S11, the cluster 12-2a periodically judges or determines whether or not the cluster 12-1a is normally operating. For example, when an answer is returned from the cluster 12-1a within a predetermined time at step S12, the cluster 12-2a determines that the cluster 12-1a is normally operating. At step S13, the cluster 12-1a supervises the cluster 12-2a. In the operation shown in FIG. 9, the cluster 12-2a sends back an answer to the cluster 12-1a at step S14. The above-mentioned operation is periodically carried out.

At step S16, if there is no answer from the cluster 12-1a by the supervising operation at step S15, the cluster 12-2a disconnects the input/output path P11 from the common memory 10 in order to make the cluster 12-1a fail at step S17. After this, if the cluster 12-1a accesses the common memory 10 at step S18, the program check occurs at step S19. At step S20, the cluster 12-1a determines that its own input/output path P11 has been disconnected from the common memory 10, and recognizes that it has been set in a failed state at step S21. Then, the cluster 12-1a performs the predetermined processes.

Figure 10:
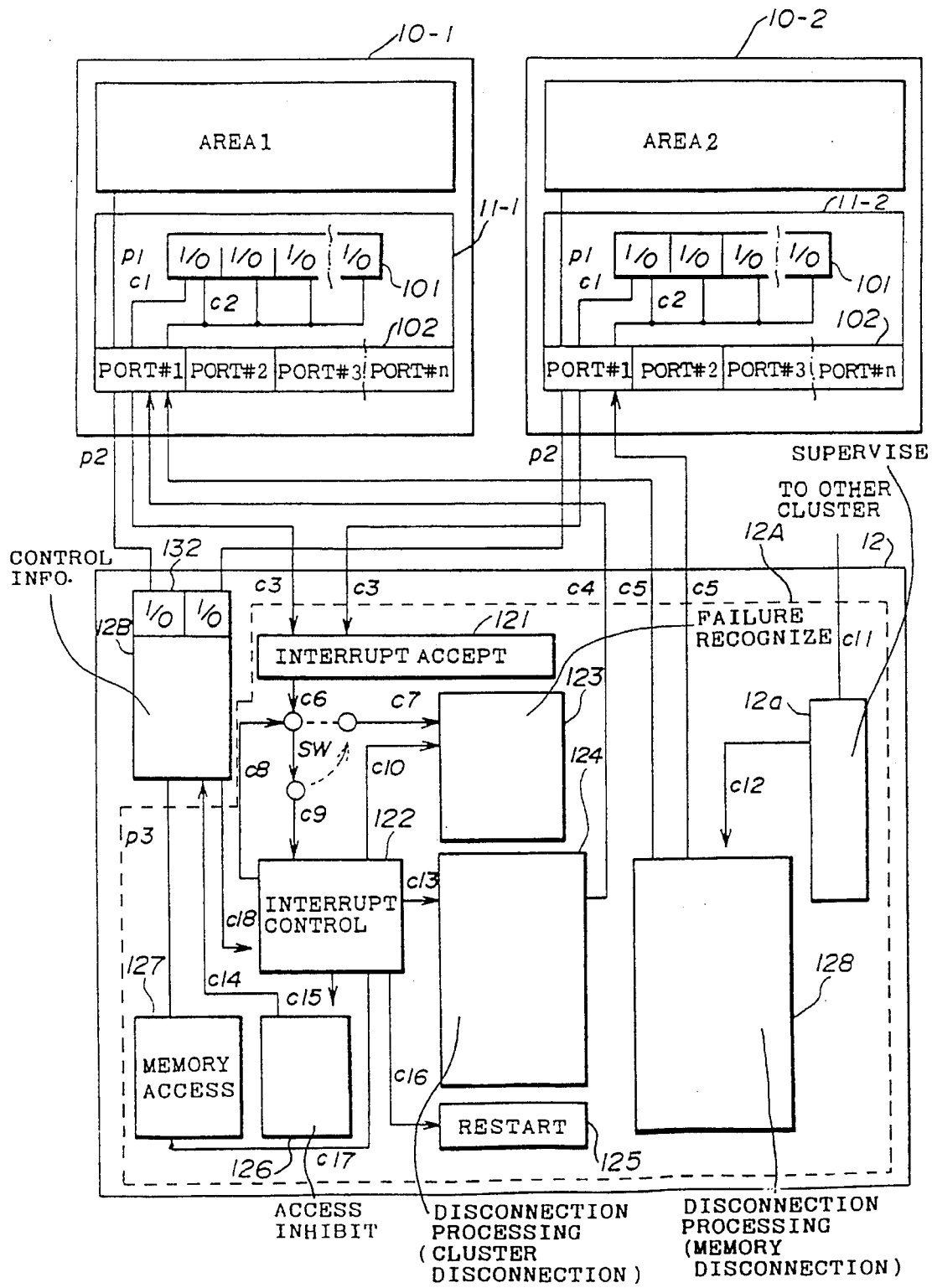
FIG. 10 is a block diagram showing a structure embodying the first and second embodiments of the present invention.

A description will now be given of a data processing system structure embodying the aforementioned first and second embodiments of the present invention. Referring to FIG. 10, the system includes the aforementioned common memories 10-1 and 10-2, and a plurality of clusters 12 (only one of which is illustrated for the sake of simplicity). As has been described previously, the common memory 10-1 includes the storage area 1 and the input/output path disconnecting mechanism 11-1, and the common memory 10-2 includes the storage area 2 and the input/output path disconnecting mechanism 11-2. The input/output path disconnecting mechanisms 11-1 and 11-2, which have the same structure and which can be comprised of processors or microprocessors, each include a control memory 101 and an input/output port 102. The control memory 101 has a plurality of one-bit storage areas provided for the respective clusters 12. That is, when there are n clusters (n is an integer), the control memory 102 has n one-bit storage areas. "1" or "0" is written into each of the one-bit areas. "1" means that the corresponding cluster 12 is allowed to access the common memory, and "0" means that the corresponding cluster 12 is not allowed to access the common memory. The input/output port 102 comprises a plurality of ports #1, #2, #3, . . . , #n, which are provided for the respective n clusters 12 (12-1 through 12-n). The port #1 related to the cluster 12 (12-1) shown in FIG. 10 is connected to the corresponding one-bit area via a control path C1, and connected to all the one-bit areas via a control path C2. A data path P1 connects the area 1 and the port #1 together. Each of the other ports #2 through #n is connected to the control memory 101 in the same way. When a cluster related to the one-bit area which stores "0" generates a request for access, the program check is generated.

Each cluster 12 comprises a first control block 12A and a second control block 12B. The first control block 12A is comprised of an interrupt acceptance block 121, an interrupt controller 122, a cluster failure recognition processing block 123, an input/output path disconnection processing block (memory disconnection processing block) 124, a restart processing block 125, an access inhibit processing block 126, a common memory accessing block 127, an input/output path disconnection processing block (cluster disconnection processing block) 128, a cluster state supervising block 129, and a switch SW. The second control block 12B has a control information block (also indicated by reference 12B) with a register circuit 132 having two one-bit registers provided for the respective common memories 10-1 and 10-2. The first control block 12A can be formed of, for example, a microprocessor, and the second control block 12B can be formed of, a hardware circuit such as a register circuit. It is also possible to form the entire structure of the cluster 12 shown in FIG. 10 of a microprocessor or the like. Although not shown for the sake of simplicity, the cluster 12 may have a memory and other elements necessary for desired progresses in accordance with the design of the cluster.

The interrupt acceptance block 121 receives the interrupts of the restorable program check from the ports #1 of the input/output path disconnecting mechanisms 11-1 and 11-2 via control paths C3. The operation of the system shown in FIG. 10 will be described below, assuming that the interrupt based on the program check occurs during the time when data is being read out from the area 1 of the common memory 10-1 in response to a request generated by the common memory accessing block 127 of the cluster 12.

When the common memory accessing block 127 generates a request for reading data out of the area 1 in the state where the system is normally operating, each of the two one-bit areas in the control information block 12B has "1", which means that the cluster 12 is allowed to access the areas 1 and 2. At this time, each of the one-bit areas of the control memory 101 in each of the common memories 10-1 and 10-2 has "1", which means that all the clusters 12 are allowed to access the areas 1 and 2. At the first step, if the interrupt of the program check occurs while data is being read out from the area 1 of the common memory 10-1 and then transferred to a memory (not shown) of the cluster 12 via data paths P1, P2 and P3, the port #1 of the input/output path disconnecting mechanism 11-1 outputs the interrupt for the program check to the interrupt acceptance block 121 of the cluster 12 via the corresponding control path C3, so that the occurrence of the error is reported to the cluster 12. At the second step, in response to this error report, the interrupt acceptance block 121 reports the occurrence of the error to the interrupt controller 122 via the switch SW and control paths C6 and C9. Normally, the switch SW connects the control paths C6 and C9 together. In response to the error report, the interrupt controller 122 receives control information registered in the one-bit registers of the control information block 12B via a control path C18. Then, at the third step, the interrupt controller 122 operates based on the relationship between the error report and the current control information in the register circuit 132 shown in FIG. 11.

At the fourth step, if the relationship shows that the cluster 12 shown in FIG. 10 fails, the interrupt processor 122 activates the cluster failure recognition processing block 123 via a control path C10. It will be noted that when only one of the common memories 10-1 and 10-2 is operating, this above procedure is carried out. The case being now considered is such that an error occurs in the area of the common memory 10-1 in the state where both the common memories 10-1 and 10-2 are normally operating. Thus, at the fifth step, the interrupt controller 122 controls the switch SW via a control path C8 so that it selects a control path C7. At the sixth step, the interrupt controller 122 makes the access inhibit processing block 126 instruct, via a control path C15, that the access to the area 1 is inhibited. Thereby, at the seventh step, the access inhibit processing block 126 writes "0" into the one-bit area of the register circuit 132 related to the area 1. That is, the value (control information) in this one-bit area changes from "1" to "0". At the eighth step, the interrupt controller 122 confirms that the control information has been changed, and requests, via a control path C13, the input/output path disconnection processing block (memory disconnection processing block) 124 to disconnect all the clusters from the area 1 of the common memory 10-1. In response to this request, at the ninth step, the input/output path disconnection processing block 124 instructs, via a control path C4, the input/output path disconnecting mechanism 11-1 to disconnect all the clusters from the area 1. At the tenth step, the above instruction is received by the port #1, which writes "0" into all the one-bit areas of the control memory 101 via the control path C2. Thereby, access to the area 1 by any of the clusters is inhibited.

After that, at the eleventh step, the interrupt controller 122 of the cluster 12 instructs the common memory accessing block 127 to access the area 2 of the common memory 10-2 via a control path C17. In response to this instruction, the common memory accessing block 127 executes the read operation on the area 2. If the access based on the read operation is successful, at the twelfth step, the interrupt controller 122 controls the switch SW via the control path C8 so that the switch SW connects the control paths C6 and C9 together (normal state of the switch). Then, the interrupt controller 122 controls the restart processing block 125 via a control path C16 so that it restarts the process which was operating when the program check interrupt took place. Then, the procedure for disconnecting the common memory 1 in which a failure (error) has occurred from the system ends.

On the other hand, if access to the area 2 of the common memory 10-2 fails, at the thirteenth step, the input/output path disconnecting mechanism 11-2 of the common memory 10-2 reports an error to the interrupt acceptance block 121 via the corresponding control path C3. Thereby, the interrupt controller 122 stops a process being carried out. At this time, the switch SW has selected the control path C7 after the aforementioned fifth step. Thus, in response to the error report from the input/output path disconnecting mechanism 11-2 of the common memory 10-2, at the fourteenth step, the interrupt acceptance block 121 activates the cluster failure recognition processing block 123, so that the cluster 12 recognizes that it itself fails.

It will be noted that the above eleventh through fourteenth steps form logic for determining whether the error has occurred in either of the common memories 10-1 or 10-2 or the cluster 12. If the cluster 12 has been disconnected, the program check interrupt always occurs.

On the other hand, the system operation carried out when a failure occurs in any of the clusters 12 will be described below. A case will be considered where both the common memories 10-1 and 10-2 are normally operating and the state supervising block 129 of the cluster 12 shown in FIG. 10 detects a failure which occurs in another cluster (not shown) connected to the port #2. As has been indicated, all the clusters mutually supervise the state of the other clusters via the state supervising blocks 129 via control paths C11 in a conventional way. The state supervising block 129 informs the input/output path disconnection processing block (cluster disconnection processing block) 128 of the occurrence of the failure in another cluster. In order to prevent the contents of the common memories 10-1 and 10-2 from being broken due to the malfunction of the defective cluster, the input/output path disconnection processing block 128 instructs, via a control path C12, the disconnecting mechanisms 11-1 and 11-2 to disconnect the input/output paths extending from the defective cluster. In response to this instruction, the input/output path disconnection processing block 128 instructs, via control paths C5, the disconnecting mechanisms 11-1 and 11-2 to disconnect the input/output paths connected to the defective cluster. This instruction is received by the port #1 of each of the common memories 10-1 and 10-2. Then, the port #1 writes "0" into the one-bit area of the control memory 101 related to the defective cluster via the control line C2 (a line connected to the one-bit area related to the defective cluster). Thereby, access to the common memories 10-1 and 10-2 by the defective cluster is inhibited. After that, if a request to access either the common memory 10-1 or 10-2 via the port #2 is generated, the program check interrupt occurs.

The present invention is not limited to the specifically disclosed embodiments, and variations and modifications may be made without departing from the scope of the present invention.

What is claimed is:

1. A data processing system, comprising:

at least one common memory;

clusters, each accessing said common memory;

input/output paths connecting said common memory and said clusters; and input/output path disconnecting means for physically disconnecting said input/output paths from said common memory, each of said clusters comprising:

input/output path disconnection processing means for controlling said input/output path disconnecting means to physically disconnect, when a failure has occurred in one of said clusters, all input/output paths connected to said one of the clusters; and cluster failure recognition processing means for stopping operation of said one of the clusters when said one of the clusters in which said failure has occurred recognizes that said failure has occurred in said one of the clusters responsive to detection of the physical disconnection via an attempted access of said common memory.

2. A data processing system as claimed in claim 1, wherein each of said clusters further comprises state supervising means for supervising states of other clusters and for judging whether each of the other clusters is normally operating.

3. A data processing system as claimed in claim 2, wherein said state supervising means of each of said clusters periodically supervises the states of the other clusters.

4. A data processing system, comprising:

common memories;

clusters, each accessing said common memories;

input/output paths connecting said common memories and said clusters; and input/output path disconnecting means for physically disconnecting input/output paths from said common memories, each of said clusters comprising:

input/output path disconnection processing means for controlling said input/output path disconnecting means to physically disconnect, when a failure has occurred in one of said clusters, all input/output paths provided between said common memories and said one of the clusters; and cluster failure recognition processing means for performing a predetermined process necessary to stop an operation of the one of said clusters and for stopping the operation of the one of said clusters when the one of said clusters in which said failure has occurred recognizes that said failure has occurred the one of said clusters responsive to detection of the physical disconnection via an attempted access of said common memories.

5. A data processing system as claimed in claim 4, wherein each of said clusters further comprises state supervising means for supervising states of other clusters and for judging whether each of the other clusters is normally operating.

6. A data processing system as claimed in claim 5, wherein said state supervising means periodically supervises the states of the other clusters.

7. A method for controlling a data processing system which has at least one common memory, clusters provided in common for each common memory, and input/output paths connecting said clusters to said common memory, said method comprising the steps of:

each cluster supervising states of others of said clusters;

physically disconnecting by a supervising cluster of input/output paths provided between said common memory and one of the clusters being supervised when a failure has occurred in said one of the clusters; and stopping an operation of said one of the clusters being supervised in which said failure has occurred by determining whether or not the input/output path extending from said one of the clusters has been disconnected from said common memory by the attempted accessing of said common memory, and stopping said one of the clusters in which said failure has occurred when it is determined that said input/output path extending from said one of the clusters has been disconnected from said common memory by the attempted accessing of said common memory.

8. A method as claimed in claim 7, wherein said method further comprises the step of performing, before the step of stopping the operation, a predetermined process necessary for stopping the operation of said one of the clusters.

* * * * *

UNITED STATES PATENT AND TRADEMARK OFFICE
CERTIFICATE OF CORRECTION

PATENT NO. : 5,568,609
DATED : October 22, 1996
INVENTOR(S) : Sugiyama et al.

It is certified that error appears in the above-indentified patent and that said Letters Patent is hereby corrected as shown below:

Column 4, line 37, change "," to --;--.

Column 8, line 4, change "2" to --12-2a has--.

Signed and Sealed this

Eleventh Day of March, 1997

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. :   5,568,609
DATED      :   October 22, 1996
INVENTOR(S) :  Sugiyama et al.

It is certified that error appears in the above-indentified patent and that said Letters Patent is hereby corrected as shown below:

Title Page, under "Foreign Application Priority Data", line 2, "Jun. 29, 1990" should be --Jun. 28, 1990--.

Signed and Sealed this

Fifteenth Day of April, 1997

*Attest:*

BRUCE LEHMAN

*Attesting Officer*    *Commissioner of Patents and Trademarks*